United States Patent
Kim et al.

(10) Patent No.: US 8,422,309 B2
(45) Date of Patent: Apr. 16, 2013

(54) VOLTAGE GENERATION CIRCUIT AND NONVOLATILE MEMORY DEVICE USING THE SAME

(75) Inventors: Byung Ryul Kim, Seoul (KR); Duck Ju Kim, Gyeonggi-do (KR); You Sung Kim, Seoul (KR); Se Chun Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 542 days.

(21) Appl. No.: 12/650,639

(22) Filed: Dec. 31, 2009

(65) Prior Publication Data

US 2010/0302881 A1 Dec. 2, 2010

(30) Foreign Application Priority Data

May 29, 2009 (KR) .................. 10-2009-0047821

(51) Int. Cl.
*G11C 11/34* (2006.01)
*G11C 16/06* (2006.01)

(52) U.S. Cl.
USPC ............ 365/185.25; 365/189.09; 365/189.11; 365/203; 365/185.18; 365/185.19

(58) Field of Classification Search ............ 365/185.18, 365/189.09, 189.11, 203, 185.25, 185.19
See application file for complete search history.

(56) References Cited

U.S. PATENT DOCUMENTS

| 5,642,309 | A * | 6/1997 | Kim et al. | 365/185.22 |
| 6,845,060 | B2 * | 1/2005 | Lee | 365/236 |
| 7,269,068 | B2 * | 9/2007 | Chae et al. | 365/185.18 |
| 7,545,680 | B2 * | 6/2009 | Kim et al. | 365/185.23 |
| 7,697,338 | B2 * | 4/2010 | Hemink | 365/185.19 |
| 2008/0151633 | A1 * | 6/2008 | Park et al. | 365/185.19 |

FOREIGN PATENT DOCUMENTS

JP 09055092 2/1997

\* cited by examiner

*Primary Examiner* — Kretelia Graham
(74) *Attorney, Agent, or Firm* — IP & T Group LLP

(57) ABSTRACT

A voltage generation circuit comprises a voltage generation control unit configured to output one of a first voltage level determination signal having a fixed data value and a second voltage level determination signal having a varying data value in response to a selection signal, and a voltage generation unit configured to generate a voltage having a single pulse form or a voltage having a pulse form whose rising edge portion rises in incremental voltage steps in response to the voltage level determination signal outputted from the voltage generation control unit.

27 Claims, 3 Drawing Sheets

VOLTAGE GENERATION CIRCUIT AND NONVOLATILE MEMORY DEVICE USING THE SAME

CROSS-REFERENCE TO RELATED APPLICATION

Priority to Korean patent application number 10-2009-0047821 filed on May 29, 2009, the entire disclosure of which is incorporated by reference herein, is claimed.

BACKGROUND

Exemplary embodiments relate to a voltage generation circuit and a nonvolatile memory device using the same, which are capable of improving the reliability of an operation in the operation of the circuit in which current consumption increases sharply/drastically.

In a known semiconductor circuit or a known memory device, current consumption may increase sharply in performing a specific operation, where such an increase raises a concern. For example, in a refresh operation of DRAM and a precharge operation of flash memory, current consumption can sharply increase. Such a sharp increase in current consumption during operations of a flash memory is described below as an example.

To write data into the memory cell of a flash memory device, a program operation is performed. The program operation is performed by supplying a program pulse to the memory cell according to an incremental step pulse program (ISPP) method, and a verification operation is performed for every pulse by checking whether the memory cell has been programmed.

If, as a result of the check, the memory cell has been programmed, the memory cell is treated as being a program pass. However, if, as a result of the check, the memory cell has not been programmed, a next program pulse is supplied to the memory cell.

Such a verification operation can be mainly divided into a bit line precharge period, an evaluation period, and a sense period. Here, in the bit line precharge period, a large current consumption occurs because the bit lines BL have to be precharged, and a voltage drop in a supply voltage occurs due to the large current consumption. Such a drop in the supply voltage affects the overall operation of the nonvolatile memory device including an internal clock of the nonvolatile memory device and raises a concern.

In the known bit line precharge period of a verification operation, a voltage is supplied to a sense unit configured to electrically couple a bit line and the precharge unit of a page buffer. A voltage level of the supplied voltage is determined based on the cut state of a fuse, where such a state is stored in an internal register. Thus, a voltage supply unit generates the voltage supplied to the page buffer through the sense unit. The voltage supply unit determines the voltage level of the voltage to be supplied to the page buffer in response to the cut state of the fuse. For example, when the cut state of a fuse is once determined, the voltage level of the voltage generated by the voltage supply unit in response thereto is determined. The voltage level of the supplied voltage, once determined, is not changed. Thus, a concern is raised with respect to the bit line precharge period in which current consumption sharply increases because a fixed voltage is to be continuously supplied as described above.

BRIEF SUMMARY

One or more embodiments relate to a nonvolatile memory device, which is capable of improving the reliability of an operation by controlling an increase in current consumption, where the current consumption increase is controlled by controlling a voltage pulse (for example, supplying a voltage pulse that gradually increases).

A voltage generation circuit according to an exemplary embodiment of this disclosure comprises a voltage generation control unit configured to output one of a first voltage level determination signal having a fixed data value and a second voltage level determination signal having a varying data value in response to a selection signal, and a voltage generation unit configured to generate a voltage having a single pulse form or a voltage having a pulse form whose rising edge portion rises in incremental voltage steps in response to the voltage level determination signal outputted from the voltage generation control unit.

A voltage generation circuit according to another aspect of this disclosure comprises a first signal output unit configured to generate a first voltage level determination signal having a fixed data value, a second signal output unit configured to output a second voltage level determination signal having a varying data value, a selection unit configured to output one of the first and second voltage level determination signals in response to a selection signal, and a voltage generation unit configured to output voltage having a single pulse form or voltage having a pulse form whose rising edge portion rises in incremental voltage steps in response to the voltage level determination signal outputted from the selection unit.

A nonvolatile memory device according to yet another embodiment of this disclosure comprises a page buffer coupled to bit lines, and a voltage generation circuit configured to generate a first sense voltage having a single pulse form or a second sense voltage having a pulse form whose rising edge portion rises in incremental voltage steps and to output the second sense voltage to the page buffer when an operation for precharging the bit lines is performed.

A nonvolatile memory device according to still yet another embodiment of this disclosure comprises a bit line coupling unit configured to couple memory cells to a bit line of a cell string, a precharge unit configured to precharge a sense node, a sense unit coupled between the bit line coupling unit and the precharge unit, a latch unit coupled to the sense node, and a voltage generation circuit configured to output a first sense voltage having a single pulse form or a second sense voltage having a pulse form whose rising edge portion rises in incremental voltage steps to the sense unit. The voltage generation circuit is configured to output the second sense voltage during an operation for precharging the bit line.

DESCRIPTION OF EMBODIMENTS

Hereinafter, exemplary embodiments of the present disclosure will be described in detail with reference to the accompanying drawings. The figures are provided to enable those having ordinary skill in the art to make and use the exemplary embodiments of the present invention.

Figure 1:
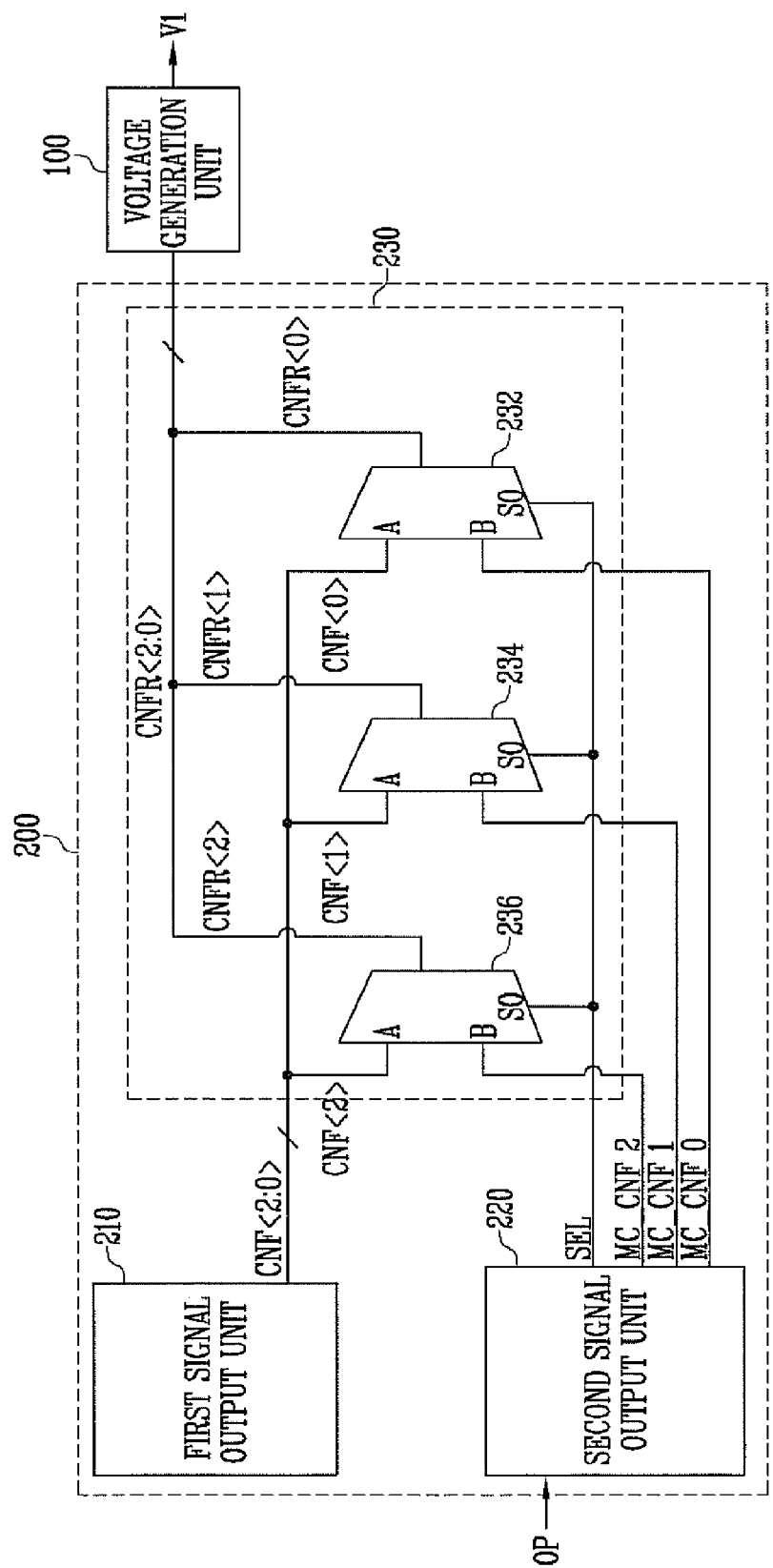
FIG. 1 is a diagram illustrating a voltage generation circuit according to an embodiment of the present disclosure.

FIG. 1 is a diagram illustrating a voltage generation circuit according to an embodiment of the present disclosure.

Referring to FIG. 1, the voltage generation circuit includes a voltage generation unit 100 and a voltage generation control unit 200.

The voltage generation control unit 200 is configured to generate voltage level determination signals CNFR<2:0>, selected from first voltage level determination signals CNF<2:0> having fixed values and second voltage level determination signals MC_CNF0, MC_CNF1, and MC_CNF2 having varying values.

More specifically, the voltage generation control unit 200 includes a first signal output unit 210, a second signal output unit 220, and a selection unit 230. The first signal output unit 210 is configured to generate the first voltage level determination signals CNF<2:0> having fixed values. The second signal output unit 220 is configured to generate the second voltage level determination signals MC_CNF0, MC_CNF1, and MC_CNF2 having varying values. The selection unit 230 is configured to select one of the first voltage level determination signal CNF<2:0> and the second voltage level determination signal MC_CNF0, MC_CNF1, and MC_CNF2 in response to a selection signal SEL.

The first signal output unit 210 can include a register configured to store the first voltage level determination signals CNF<2:0>.

The second signal output unit 220 can include a control unit configured to generate the second voltage level determination signals MC_CNF0, MC_CNF1, and MC_CNF2. The second signal output unit 220 can generate the second voltage level determination signals (MC_CNF0, MC_CNF1, and MC_CNF2) and the selection signal SEL.

In the embodiment of FIG. 1, each of the first voltage level determination signal CNF<2:0> and the second voltage level determination signal MC_CNF0, MC_CNF1, and MC-CNF2 can have 3 bits of data. According to this example, the first and second voltage level determination signals can be outputted to each represent eight different data values. Alternatively, the voltage level of voltage V1 generated from the voltage generation unit 100 can be controlled to be set at eight different voltage levels in response to the eight different values of data. For example, the voltage V1 can be any one of selectable voltages starting from 1.3 V and ending at 2.0 V that are spaced apart from each other by a unit voltage of 0.1 V.

The first signal output unit 210 is configured to include a number of fuses (e.g., three fuses) and to generate the first voltage level determination signal CNF<2:0> having data values determined in response to the cut states of the fuses. According to an exemplary embodiment of the present disclosure, the first voltage level determination signal CNF<2:0> generated from the first signal output unit 210 correspond to respective pieces of information about the fuse cut states and have fixed values. For example, the first voltage level determination signal CNF<2:0> can have a fixed value, such as 001. When the first voltage level determination signal CNF<2:0> having such a fixed value is selected and inputted to the voltage supply unit 100, the voltage generation unit 100 outputs the voltage V1 of 1.4 V, which is 0.1 V higher than lowest voltage V1 having 1.3 V, in response to the first voltage level determination signals CNF<2:0>. Here, the voltage V1 may be outputted in the form of a single pulse.

The second signal output unit 220 is configured to generate the second voltage level determination signal MC_CNF0, MC_CNF1, and MC_CNF2. In particular, the second signal output unit 220 may be operated in response to receiving signal OP, which indicates an operation in which current consumption sharply increases (e.g., signal OP may be the precharge signal of flash memory and the refresh signal of DRAM).

The second signal output unit 220 is configured to generate the second voltage level determination signal MC_CNF0, MC_CNF1, and MC-CNF2 which is used to sequentially raise the voltage V1. For example, the second signal output unit 220 can consecutively output the second voltage level determination signal MC_CNF0, MC_CNF1, and MC-CNF2 that progresses through eight different data states (000 to 111). When receiving the second voltage level determination signal MC_CNF0, MC_CNF1, and MC-CNF2, the voltage generation unit 100 outputs the voltage V1 of a pulse form whose rising edge rises in incremental voltage steps in response to the second voltage level determination signal MC_CNF0, MC_CNF1, and MC-CNF2.

The selection unit 230 is configured to select one of the first and second voltage level determination signals and to output a selected signal to the voltage generation unit 100. The selection unit 230 includes a first bit selection unit 232, a second bit selection unit 234, and a third bit selection unit 236.

The first bit selection unit 232 is configured to select one of the first bit CNF<0> of the first voltage level determination signal and the first bit MC_CNF0 of the second voltage level determination signal and to output a selected one as an output bit CNFR<0> in response to the selection signal SEL.

The second bit selection unit 234 is configured to select one of the second bit CNF<1> of the first voltage level determination signal and the second bit MC_CNF1 of the second voltage level determination signal and to output a selected one as an output signal CNFR<1> in response to the selection signal SEL.

The third bit selection unit 236 is configured to select one of the third bit CNF<2> of the first voltage level determination signal and the third bit MC_CNF2 of the second voltage level determination signal and to output a selected one as an output bit CNFR<2> in response to the selection signal SEL.

The same selection signal SEL is inputted to the first bit selection unit 232, the second bit selection unit 234, and the third bit selection unit 236. Accordingly, the bits of the first voltage level determination signal can be selected and outputted at the same time, or the bits of the second voltage level determination signal can be selected and outputted at the same time.

Although, according to an exemplary embodiment, each of the first voltage level determination signal and the second voltage level determination signal includes three bits of data, such disclosure is not to be construed as limiting. For example, each of the first voltage level determination signal and the second voltage level determination signal can be configured to include different numbers of data bits. Accordingly, the number of bit selection units included in the selection unit 230 can also vary depending on the number of data bits constituting each of the first voltage level determination signal and the second voltage level determination signal.

According to an example, the second signal output unit 220 is configured to generate the selection signal SEL for controlling the selection unit 230. The selection unit 230 selects one of the first voltage level determination signal CNF<2:0> and the second voltage level determination signal MC_CNF0, MC_CNF1, and MC-CNF2 and outputs a selected signal in response to the selection signal SEL. For example, when receiving the selection signal SEL of a high level, the selection unit 230 can select and output the second voltage level determination signal MC_CNF0, MC_CNF1, and MC-CNF2. When receiving the selection signal SEL of a low level, the selection unit 230 can output the first voltage level determination signal CNF<2:0>.

The voltage generation unit 100 outputs the V1 voltage having a single pulse form or the V1 voltage having a pulse form whose rising edge portion rises in incremental voltage steps in response to a level determination signal outputted from the voltage generation control unit 200. When the voltage V1 is used for the precharge operation of a peripheral circuit, a sharp increase in current consumption can be prevented/reduced because the voltage V1 rises in incremental voltage steps.

Figure 2:
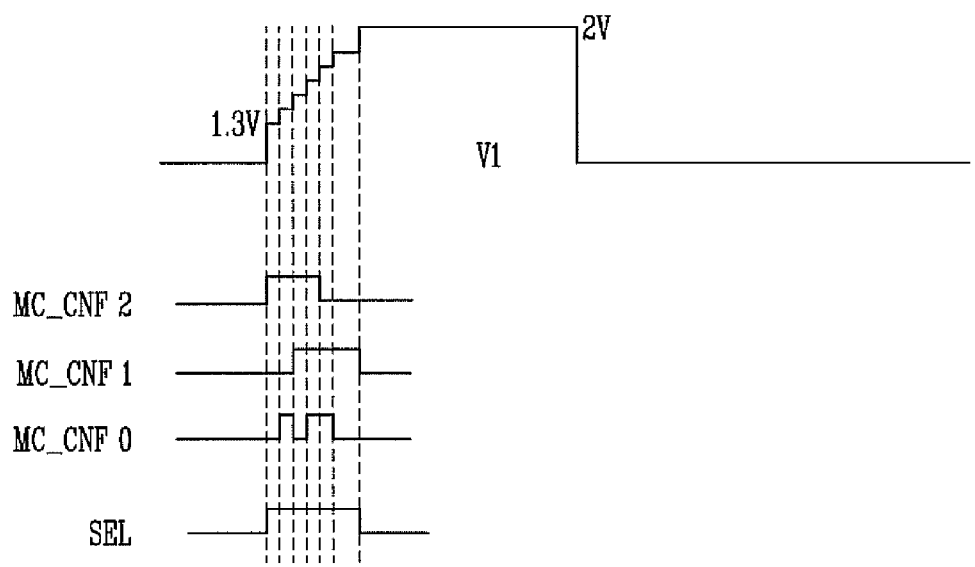
FIG. 2 is a timing diagram illustrating the voltage generation circuit according to the embodiment of the present disclosure.

FIG. 2 is a timing diagram illustrating the voltage generation circuit 100 according to the embodiment of the present disclosure.

Referring to FIG. 2, during a period in which the selection signal SEL is at a high level, the second voltage level determination signal MC_CNF0, MC_CNF1, and MC-CNF2 is selected and determines a level of the voltage V1. A relationship between the second voltage level determination signal MC_CNF0, MC_CNF1, and MC-CNF2 and the levels of the voltage V1 is listed in the following table.

TABLE 1

| MC_CNF 0 | MC_CNF 1 | MC_CNF 2 | V1 |
|---|---|---|---|
| 0 | 0 | 1 | 1.3 V |
| 1 | 0 | 1 | 1.4 V |
| 0 | 1 | 1 | 1.5 V |
| 1 | 1 | 1 | 1.6 V |
| 1 | 1 | 0 | 1.7 V |
| 0 | 1 | 0 | 1.8 V |

In FIG. 2, a maximum value of the voltage V1 outputted from the voltage generation unit 100 is 2 V. The level of the voltage V1 having a pulse form whose rising edge portion rises in incremental voltage steps is determined according to data states of the second voltage level determination signals MC_CNF0, MC_CNF1, and MC-CNF2 outputted from the second signal output unit 220. For example, as shown in Table 1, if the second signal output unit 220 outputs the second voltage level determination signal MC_CNF0, MC_CNF1, and MC-CNF2 having six different bit states during the output period, the voltage generation unit 100 outputs the voltage V1 having a pulse form whose rising edge portion rises in incremental voltage steps of 0.1V from 1.3 V up to 1.8 V in response.

As described above, during the period in which the selection signal SEL is at a high level, the second voltage level determination signal MC_CNF0, MC_CNF1, and MC-CNF2 is selected. The level of voltage V1 is sequentially increased in response to the second voltage level determination signal MC_CNF0, MC_CNF1, and MC-CNF2 and then supplied to the sense unit 330. Accordingly, in the present disclosure, current consumption through bit lines can be reduced, and a voltage drop in a supply voltage can also be reduced.

According to an exemplary embodiment, the voltage generation circuit can be applied to a variety of elements requiring an operation whose current consumption increases sharply. For example, a nonvolatile memory device may use the voltage generation circuit as illustrated below.

Figure 3:
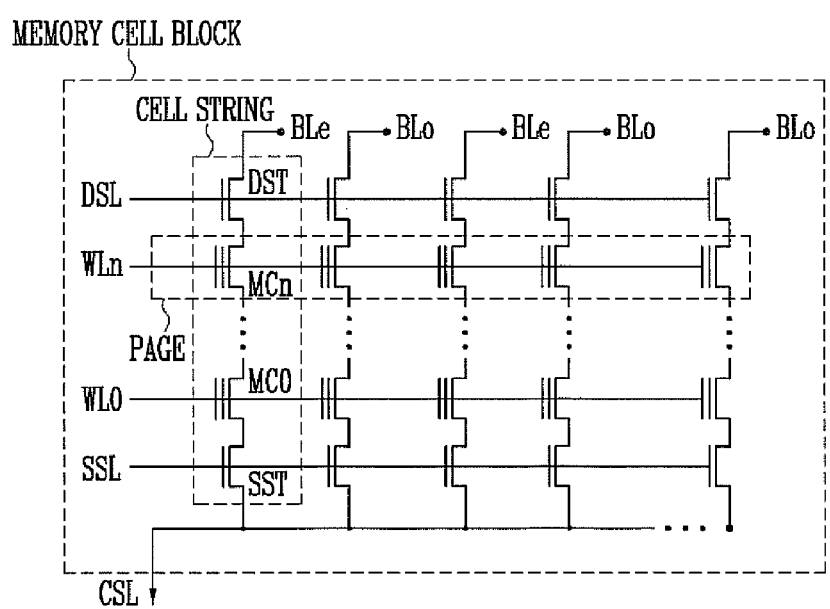
FIG. 3 is a circuit diagram showing the configuration of a cell array of a nonvolatile memory device.

FIG. 3 is a circuit diagram showing the configuration of the cell array of a nonvolatile memory device. Referring to FIG. 3, the memory cell array may include a number of memory cell blocks while only one such memory cell block is shown for illustration purposes.

The memory cell array includes a number of the memory cell blocks. Each of the memory cell blocks includes a number of strings that are each coupled to a bit line BL, and the memory cell blocks are coupled in parallel to a common global source line CSL. Each of the strings includes memory cells MC0 to MCn for storing data, a drain select transistor DST coupled between the bit line BL and the memory cells, and a source select transistor SST coupled between the memory cells and the global source line CSL. The gates of the drain select transistors DST are interconnected to form a drain selection line DSL, the gates of the source select transistors SST are interconnected to form a source selection line SSL, and the gates of the memory cells are interconnected to respective word lines WL. In FIG. 1, each of the word lines may also be referred to as "a page." Further, an even bit line BLe and an odd bit line BLo are alternately coupled to the cell strings.

Figure 4:
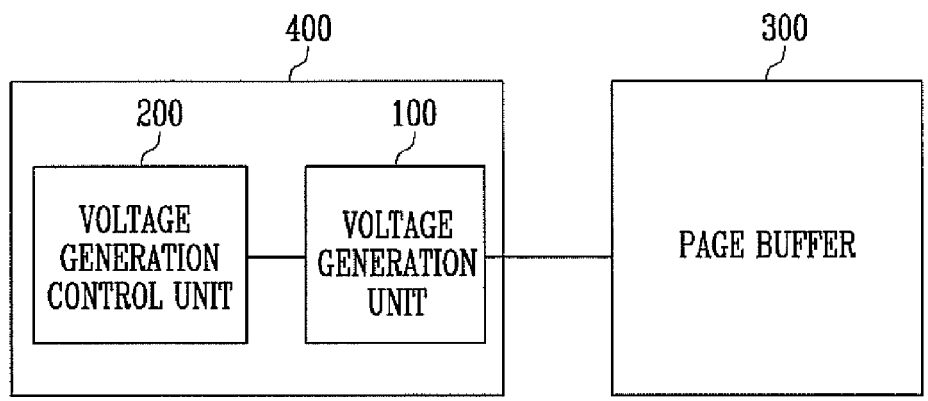
FIG. 4 is a block diagram of a nonvolatile memory device according to an embodiment of the present disclosure.

FIG. 4 is a block diagram of the nonvolatile memory device according to an embodiment of the present disclosure.

Referring to FIG. 4, the nonvolatile memory device includes a page buffer 300 and a voltage generation circuit 400.

The page buffer 300 is coupled to bit lines and is configured to precharge or discharge the bit lines and to temporarily store data read from memory cells. The page buffer 300 is described in detail below.

The voltage generation circuit 400 is configured to generate a first sense voltage, having a single pulse form, or a second sense voltage, having a pulse form whose rising edge portion rises in incremental voltage steps, and to output the second sense voltage to the page buffer 300 when a precharge operation of a bit line is performed.

The voltage generation circuit 400 has the same construction and operation described above with reference to FIG. 1, and thus, a further description thereof is omitted.

Figure 5:
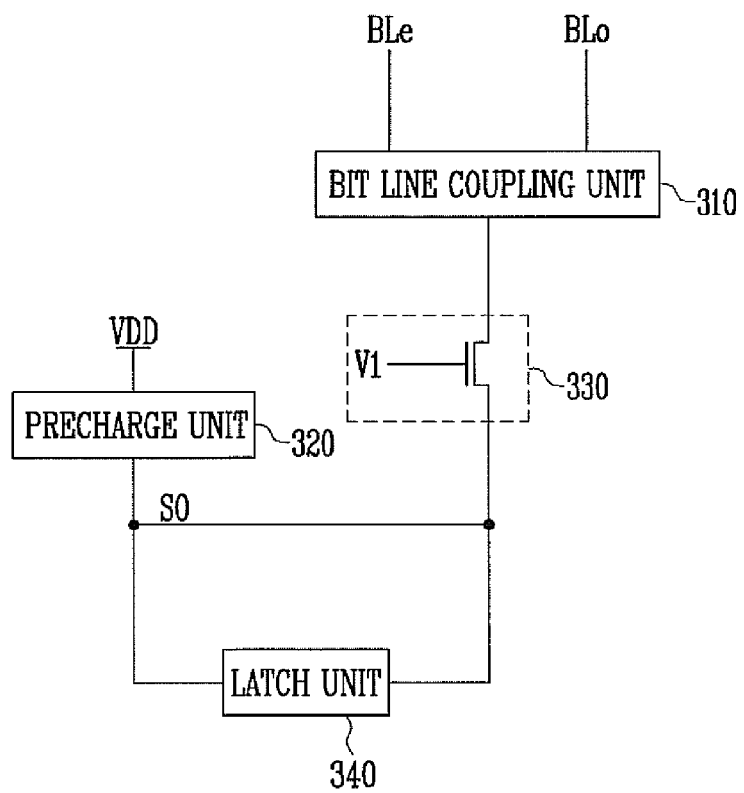
FIG. 5 is a block diagram of a page buffer according to an embodiment of the present disclosure.

FIG. 5 is a block diagram of the page buffer according to an embodiment of the present disclosure.

Referring to FIG. 5, the page buffer 300 includes a bit line coupling unit 310, a precharge unit 320, a sense unit 330, and a latch unit 340.

The bit line coupling unit 310 is configured to couple the memory cells to the bit line of a cell string.

The precharge unit 320 is configured to precharge a sense node SO. The precharge unit 320 can include a PMOS transistor (not shown) having a gate to which a precharge signal is inputted. When the PMOS transistor is turned on in response to the precharge signal, a voltage VDD is coupled to the sense node SO, so that the sense node SO is precharged.

The sense unit 330 is coupled between the bit line coupling unit 310 and the precharge unit 320 and is configured to detect the level of a voltage at the bit line. The sense unit 330 can include an NMOS transistor having a gate to which a sense voltage V1 is inputted. According to an example, the sense voltage V1 outputted from the voltage generation circuit 400 is inputted to the sense unit 330.

The latch unit 340 is coupled to the sense node SO and is configured to temporarily store data.

In the nonvolatile memory device including a page buffer, such as that shown in FIG. 5, when a read operation or a verification operation is performed, current consumption may increase drastically in precharging the bit line. In this case, the voltage generation circuit 400 outputs the voltage V1 of a pulse form whose rising edge portion rises in incremental voltage steps. Accordingly, a sharp voltage drop in a supply voltage can be prevented/reduced.

According to the present disclosure, when a nonvolatile memory device operates, a voltage which rises in incremental voltage steps is supplied. Accordingly, a drastic voltage drop in a supply voltage can be prevented/reduced, and the performance of the operation can be improved. Thus, abnormal operations of peripheral circuits resulting from a drastic drop in a supply voltage can be prevented/reduced.

What is claimed is:

1. A voltage generation circuit, comprising:
a voltage generation control unit configured to output one of a first voltage level determination signal having a fixed data value and a second voltage level determination signal having a varying data value in response to a selection signal; and
a voltage generation unit configured to generate a voltage having a single pulse form in response to the first voltage level determination signal and generate a voltage having a pulse form whose rising edge portion rises in incremental voltage steps in response to the second voltage level determination signal, wherein
the voltage generation control unit comprises:
a first signal output unit configured to generate the first voltage level determination signal having the fixed data value;
a second signal output unit configured to generate the second voltage level determination signal having the varying data value; and
a selection unit configured to output one of the first and second voltage level determination signals in response to the selection signal.

2. The voltage generation circuit of claim 1, wherein the second signal output unit outputs the selection signal.

3. The voltage generation circuit of claim 1, wherein the selection unit comprises a multiplexer.

4. The voltage generation circuit of claim 1, wherein:
each of the first voltage level determination signal and the second voltage level determination signal comprises a number of data bits, and
the selection unit comprises a number of bit selection units each configured to select one of a bit of the first voltage level determination signal and a bit of the second voltage level determination signal.

5. The voltage generation circuit of claim 4, wherein each of the bit selection units comprises a multiplexer.

6. A voltage generation circuit, comprising:
a first signal output unit configured to generate a first voltage level determination signal having a fixed data value;
a second signal output unit configured to output a second voltage level determination signal having a varying data value;
a selection unit configured to output one of the first and second voltage level determination signals in response to a selection signal; and
a voltage generation unit configured to output a voltage having a single pulse form in response to the first voltage level determination signal outputted from the selection unit and output a voltage having a pulse form whose rising edge portion rises in incremental voltage steps in response to the second voltage level determination signal outputted from the selection unit.

7. The voltage generation circuit of claim 6, wherein the second signal output unit outputs the selection signal.

8. The voltage generation circuit of claim 6, wherein the selection unit comprises a multiplexer.

9. The voltage generation circuit of claim 6, wherein:
each of the first voltage level determination signal and the second voltage level determination signal comprises a number of data bits, and
the selection unit comprises a number of bit selection units each configured to select one of a bit of the first voltage level determination signal and a bit of the second voltage level determination signal.

10. The voltage generation circuit of claim 9, wherein each of the bit selection units comprises a multiplexer.

11. A nonvolatile memory device, comprising:
a page buffer coupled to bit lines; and
a voltage generation circuit configured to generate a first sense voltage having a single pulse form or a second sense voltage having a pulse form whose rising edge portion rises in incremental voltage steps and to output the second sense voltage to the page buffer when an operation for precharging the bit lines is performed.

12. The nonvolatile memory device of claim 11, wherein the page buffer comprises:
a bit line coupling unit configured to couple memory cells to the bit lines;
a precharge unit configured to precharge a sense node;
a sense unit coupled between the bit line coupling unit and the precharge unit; and
a latch unit coupled to the sense node.

13. The nonvolatile memory device of claim 11, wherein the voltage generation circuit comprises:
a voltage generation control unit configured to output one of a first voltage level determination signal having a fixed data value and a second voltage level determination signal having a varying data value in response to a selection signal; and
a voltage generation unit configured to generate the first sense voltage in response to the first voltage level determination signal and generate the second sense voltage in response to the second voltage level determination signal.

14. The nonvolatile memory device of claim 13, wherein the voltage generation control unit comprises:
a first signal output unit configured to generate the first voltage level determination signal having the fixed data value;
a second signal output unit configured to generate the second voltage level determination signal having the varying data value; and
a selection unit configured to output one of the first and second voltage level determination signals in response to the selection signal.

15. The nonvolatile memory device of claim 11, wherein the voltage generation circuit comprises:
a first signal output unit configured to generate a first voltage level determination signal having a fixed data value;
a second signal output unit configured to output a second voltage level determination signal having a varying data value;
a selection unit configured to output one of the first and second voltage level determination signals in response to a selection signal; and
a voltage generation unit configured to output the first sense voltage in response to the first voltage level determination signal outputted from the selection unit and output the second sense voltage in response to the second voltage level determination signal outputted from the selection unit.

16. The nonvolatile memory device of claim 15, wherein the second signal output unit outputs the selection signal.

17. The nonvolatile memory device of claim 15, wherein the selection unit comprises a multiplexer.

18. The nonvolatile memory device of claim 15, wherein:
each of the first voltage level determination signal and the second voltage level determination signal comprises a number of data bits, and
the selection unit comprises a number of bit selection units each configured to select one of a bit of the first voltage level determination signal and a bit of the second voltage level determination signal.

19. The nonvolatile memory device of claim 15, wherein the selection unit comprises a multiplexer.

20. A nonvolatile memory device, comprising:
a bit line coupling unit configured to couple memory cells to a bit line of a cell string;
a precharge unit configured to precharge a sense node;
a sense unit coupled between the bit line coupling unit and the precharge unit;
a latch unit coupled to the sense node; and
a voltage generation circuit configured to output a first sense voltage having a single pulse form or a second sense voltage having a pulse form whose rising edge portion rises in incremental voltage steps to the sense unit,
wherein the voltage generation circuit is configured to output the second sense voltage during an operation for precharging the bit line.

21. The nonvolatile memory device of claim 20, wherein the voltage generation circuit comprises:
a voltage generation control unit configured to output one of a first voltage level determination signal having a fixed data value and a second voltage level determination signal having a varying data value in response to a selection signal; and
a voltage generation unit configured to generate the first sense voltage in response to the first voltage level determination signal and the second sense voltage in response to the second voltage level determination signal.

22. The nonvolatile memory device of claim 21, wherein the voltage generation control unit comprises:
a first signal output unit configured to generate the first voltage level determination signal having the fixed data value;
a second signal output unit configured to generate the second voltage level determination signal having the varying data value; and
a selection unit configured to output one of the first and second voltage level determination signals in response to the selection signal.

23. The nonvolatile memory device of claim 20, wherein the voltage generation circuit comprises:
a first signal output unit configured to generate a first voltage level determination signal having a fixed data value;
a second signal output unit configured to output a second voltage level determination signal having a varying data value;
a selection unit configured to output one of the first and second voltage level determination signals in response to a selection signal; and
a voltage generation unit configured to output the first sense voltage in response to the first voltage level determination signal outputted from the selection unit and the second sense voltage in response to the second voltage level determination signal outputted from the selection unit.

24. The nonvolatile memory device of claim 23, wherein the second signal output unit outputs the selection signal.

25. The nonvolatile memory device of claim 23, wherein the selection unit comprises a multiplexer.

26. The nonvolatile memory device of claim 23, wherein:
each of the first voltage level determination signal and the second voltage level determination signal comprises a number of data bits, and
the selection unit comprises a number of bit selection units each configured to select one of a bit of the first voltage level determination signal and a bit of the second voltage level determination signal.

27. The nonvolatile memory device of claim 26, wherein each of the bit selection units comprises a multiplexer.

\* \* \* \* \*